(12) United States Patent
Shiau et al.

(10) Patent No.: US 10,325,632 B2
(45) Date of Patent: Jun. 18, 2019

(54) INTERMEDIATE CIRCUIT FOR MEMORY CARD ACCESS

(71) Applicant: REALTEK SEMICONDUCTOR CORPORATION, Hsinchu (TW)

(72) Inventors: Jiunn-Hung Shiau, Taipei (TW); Neng-Hsien Lin, Kaohsiung (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/671,636

(22) Filed: Aug. 8, 2017

(65) Prior Publication Data

US 2018/0137897 A1 May 17, 2018

(30) Foreign Application Priority Data

Nov. 14, 2016 (TW) .............................. 105136993 A (51) Int. Cl.
*G11C 7/10* (2006.01)
*G06F 13/38* (2006.01)

(52) U.S. Cl.
CPC .......... *G11C 7/1006* (2013.01); *G06F 13/387* (2013.01)

(58) Field of Classification Search
CPC ...................................................... H05K 7/10
See application file for complete search history.

(56) References Cited

U.S. PATENT DOCUMENTS

| 8,013,413 | B2 | 9/2011 | Frew et al. |
| 8,240,575 | B2 | 8/2012 | Kim et al. |
| 2007/0080224 | A1 | 4/2007 | Kou et al. |
| 2010/0138580 | A1* | 6/2010 | Asfur .................... G06F 13/385 710/301 |
| 2011/0072185 | A1 | 3/2011 | Pinto et al. |

FOREIGN PATENT DOCUMENTS

TW          200709029          8/2005

OTHER PUBLICATIONS

TW 200709029 is also published as US20070080224.
OA letter of U.S. Appl. No. 15/671,568 dated Mar. 19, 2019.

* cited by examiner

*Primary Examiner* — Hoai V Ho
(74) *Attorney, Agent, or Firm* — WPAT, PC (57) ABSTRACT

The present invention discloses an intermediate circuit including: a detection circuit generating a detection result indicating a memory card signal conforming to one of a first and a second voltage specifications which specify a higher first operation voltage and a lower second operation voltage respectively; a control circuit generating a conversion control signal and a selection control signal according to the detection result; a conversion circuit converting the memory card signal into a card-to-system conversion signal conforming to the second voltage specification according to the conversion control signal when the memory card signal conforms to the first voltage specification; and a selection circuit outputting the card-to-system conversion signal according to the selection control signal when the memory card signal conforms to the first voltage specification, and outputting the memory card signal according to the selection control signal when the memory card signal conforms to the second voltage specification.

5 Claims, 6 Drawing Sheets

INTERMEDIATE CIRCUIT FOR MEMORY CARD ACCESS

BACKGROUND OF THE INVENTION

1. Field of the Invention

The present invention relates to memory card access, especially to an intermediate circuit for memory card access.

2. Description of Related Art

Figure 1:
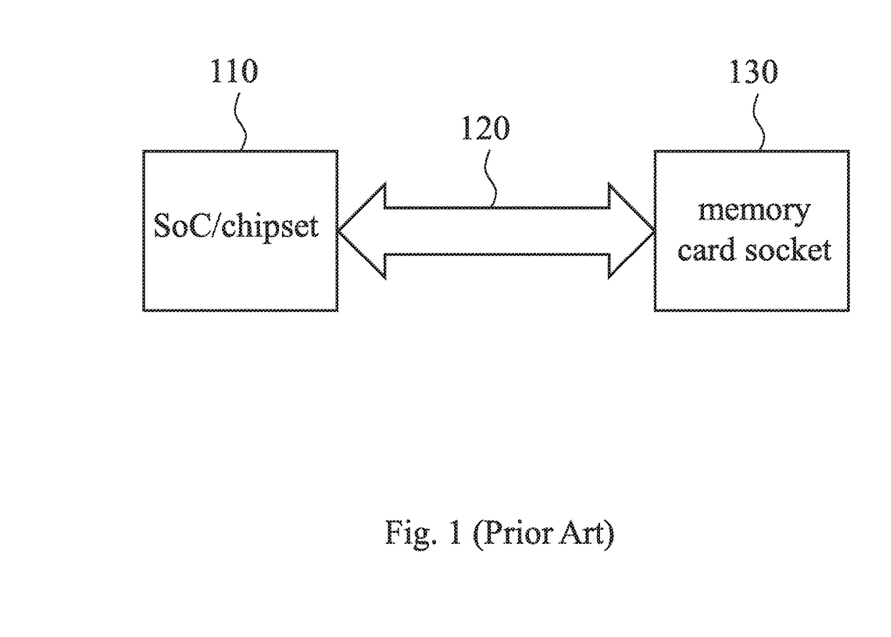
FIG. 1 illustrates a memory card access operation of a prior art.

Generally speaking, a memory card access operation is carried out by an independent card reader chip, or by a system on chip (SoC) or a chipset capable of memory card access. Since the current trend of an electronic device is towards multi-function integration and miniaturization, an SoC/chipset capable of memory card access is growing popular, and its way to access a memory card is shown in FIG. 1. As shown in FIG. 1, an SoC/Chipset 110 is usually connected to a memory card socket 130 through a transmission interface 120, and thereby accesses a memory card in the memory card socket 130.

As the manufacturing process of an SoC/chipset develops, the operation voltage of the SoC/chipset turns lower. However, a lot of conventional memory cards still need to he accessed in a high voltage. If an SoC/chipset incorporates the design of a high voltage operation for ensuring compatibility, the SoC/chipset will consume more chip area, which leads to the increase of cost and the disadvantage of miniaturization. In consideration of the above, some association (e.g., memory card association) starts discussing a low voltage signal (LVS) protocol for memory card access. However, since a lot of conventional memory cards in support of a high voltage operation (that is specified by a high voltage signal (HVS) protocol) are still in use, the compatibility problem caused by the LVS protocol in the future is foreseeable.

SUMMARY OF THE INVENTION

An object of the present invention is to provide an intermediate circuit for making an improvement over the prior art.

The present invention discloses an intermediate circuit for memory card access. An embodiment of the intermediate circuit is applicable to a card-to-system operation, and comprises a detection circuit, a control circuit, a conversion circuit and a selection circuit. The detection circuit detects a memory card signal to generate a detection result indicating the memory card signal conforming to one of a plurality of signal voltage specifications, in which the plurality of signal voltage specifications includes a first voltage specification and a second voltage specification, the first voltage specification specifies a first operation voltage, the second voltage specification specifies a second operation voltage, and the first operation voltage is higher than the second operation voltage. The control circuit generates a conversion control signal and a selection control signal according to the detection result. The conversion circuit converts the memory card signal into a card-to-system conversion signal conforming to the second voltage specification according to the conversion control signal when the detection result indicates that the memory card signal conforms to the first voltage specification. The selection circuit receives the card-to-system conversion signal and outputs the card-to-system conversion signal as a system-side output signal according to the selection control signal when the detection result indicates that the memory card signal conforms to the first voltage specification; and the selection control circuit receives the memory card signal and outputs the memory card signal as the system-side output signal according to the selection control signal when the detection result indicates that the memory card signal conforms to the second voltage specification.

Another embodiment of the intermediate circuit is applicable to a system-to-card operation, and comprises a detection circuit, a control circuit, a conversion circuit and a selection circuit. The detection circuit detects a memory card signal to generate a detection result indicating the memory card signal conforming to one of a plurality of signal voltage specifications, in which the plurality of signal voltage specifications includes a first voltage specification and a second voltage specification, the first voltage specification specifies a first operation voltage, the second voltage specification specifies a second operation voltage, and the first operation voltage is higher than the second operation voltage. The control circuit generates a conversion control signal and a selection control signal according to the detection result. The conversion circuit converts a system-side signal into a system-to-card conversion signal as a card-side output signal according to the conversion control signal when the detection result indicates that the memory card signal conforms to the first voltage specification, in which the system-side signal conforms to the second voltage specification and the system-to-card conversion signal conforms to the first voltage specification. The selection circuit receives the system-side signal and outputs the system-side signal to the conversion circuit according to the selection control signal for the conversion circuit generating the system-to-card conversion signal as the card-side output signal when the detection result indicates that the memory card signal conforms to the first voltage specification; and the selection control circuit receives the system-side signal and outputs the system-side signal as the card-side output signal according to the selection control signal when the detection result indicates that the memory card signal conforms to the second voltage specification.

A further embodiment of the intermediate circuit is applicable to both a card-to-system operation and a system-to-card operation, and comprises a conversion circuit. The conversion circuit is configured to receive a memory card signal according to a first voltage specification, convert the memory card signal into a card-to-system conversion signal conforming to a second voltage specification, and output the card-to-system conversion signal to a system; and the conversion circuit is also configured to receive a system-side signal according to the second voltage specification, convert the system-side signal into a system-to-card conversion signal conforming to the first voltage specification, and output the system-to-card conversion signal to a memory card. The above-mentioned first voltage specification specifies a first operation voltage, the second voltage specification specifies a second operation voltage, and the first operation voltage is higher than the second operation voltage.

These and other objectives of the present invention will no doubt become obvious to those of ordinary skill in the art after reading the following detailed description of the exemplary embodiments that are illustrated in the various figures and drawings.

BRIEF DESCRIPTION OF THE DRAWINGS

FIG. 3 illustrates an embodiment of the conversion circuit of FIG. 2a.

DETAILED DESCRIPTION OF THE PREFERRED EMBODIMENTS

The present invention discloses an intermediate circuit for memory card access. This intermediate circuit is capable of improving the compatibility of memory card access without changing the existing design of memory card access. In the following description, a memory card signal/a system-side memory card signal (hereafter, system-side signal) includes data that are read from/to be written into a memory card, and/or includes instruction(s) for controlling/informing the memory card/a system; and such signal definition/characteristic is well known in this industrial field.

Figure 2A:
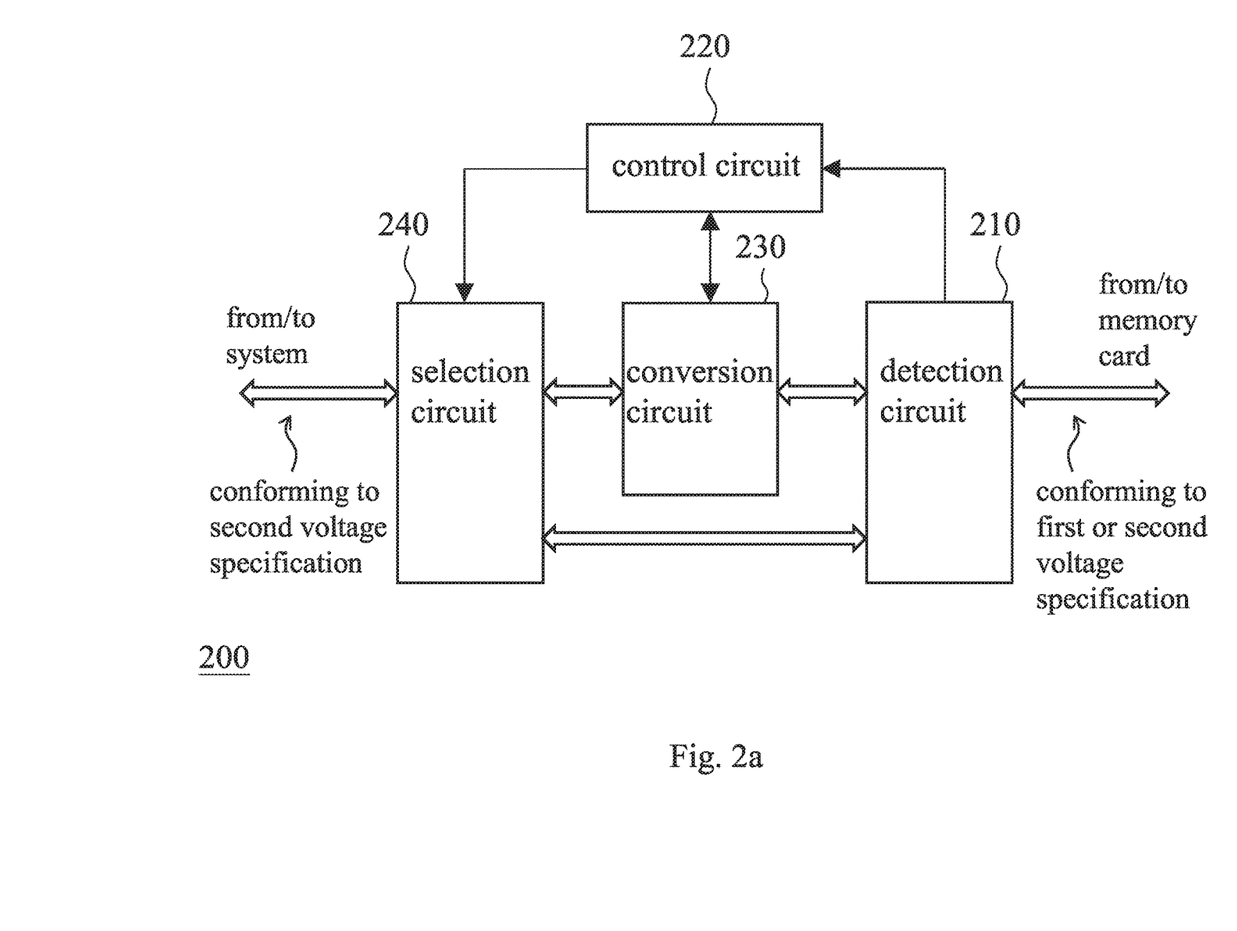
FIG. 2a illustrates an embodiment of the intermediate circuit of the present invention.

Please refer to FIG. 2a. FIG. 2a shows an embodiment of the intermediate circuit of the present invention. The intermediate circuit 200 of FIG. 2a comprises a detection circuit 210, a control circuit 220, a conversion circuit 230 and a selection circuit 240. The intermediate circuit 200 is applicable to both a card-to-system operation and a system-to-card operation. The transmission signal between a memory card and the intermediate circuit 200 conforms to one of a plurality of signal voltage specifications. An example of the signal voltage specifications includes a low voltage signal (LVS) specification and a high voltage signal (HVS) specification; of course people of ordinary skill in the art can use other kinds of specifications as the plurality of signal voltage specifications in accordance with their demand and the disclosure of the present invention. The transmission signal between a system (a.k.a. host) and the intermediate circuit 200 conforms to a specific signal voltage specification. An example of the specific signal voltage specification is an LVS specification; of course those of ordinary skill in the art can use another kind of specification as the specific signal voltage specification in accordance with their demand and the disclosure of the present invention, but the specific signal voltage specification is better to be one of the aforementioned plurality of signal voltage specifications so that a signal may be transmitted from a card/system to a system/card without conversion as long as the specification (e.g., LVS specification) of the transmission signal between the memory card and the intermediate circuit 200 is the same as the specification (e.g., LVS specification) of the transmission signal between the system and the intermediate circuit 200.

Figure 2B:
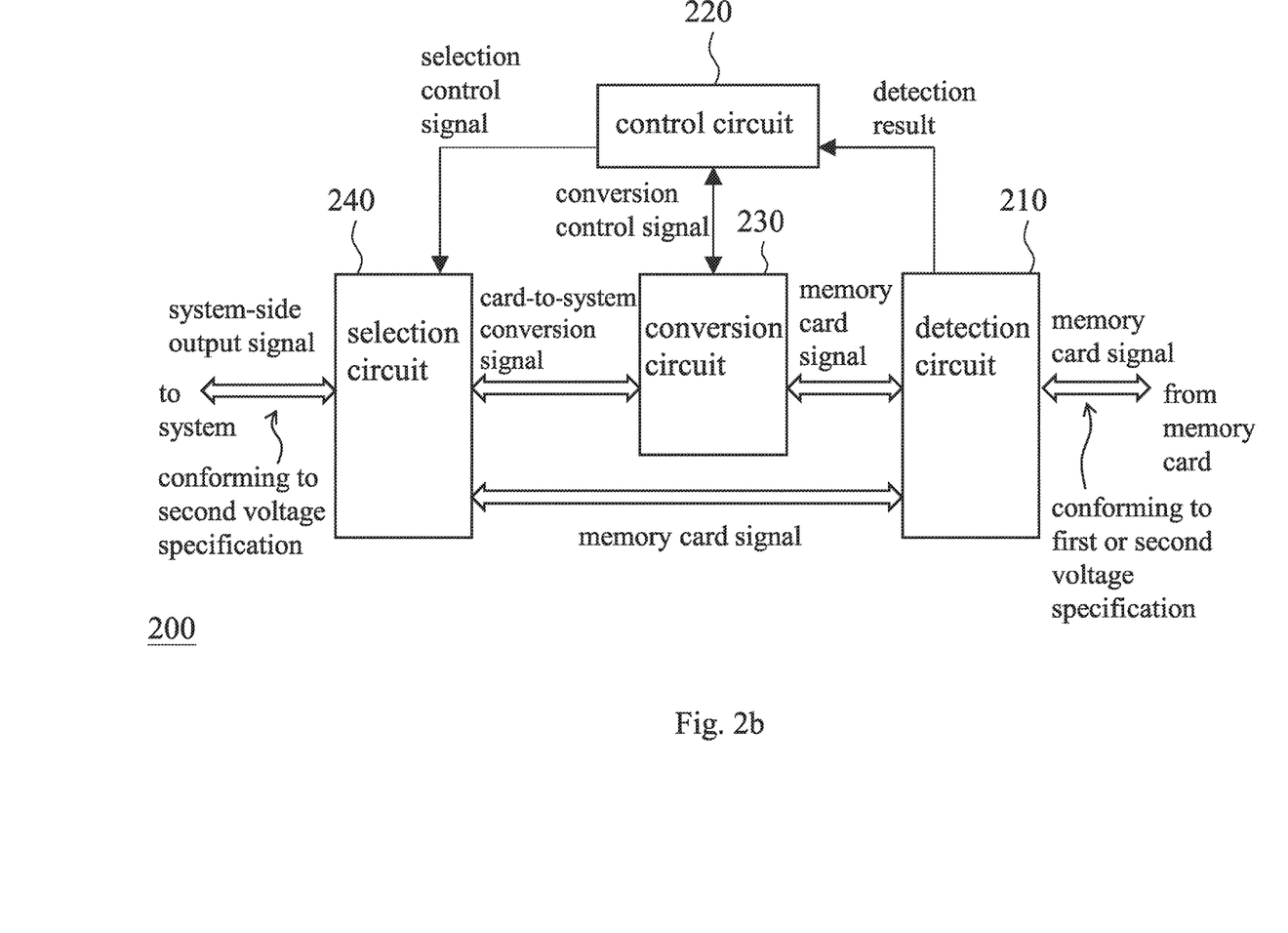
FIG. 2b illustrates the intermediate circuit of FIG. 2a for a card-to-system operation.

Please refer to FIG. 2b which shows how the intermediate circuit 200 works for a card-to-system operation. The detection circuit 210 detects a memory card signal from a memory card and generates a detection result accordingly. The detection result indicates that the memory card signal conforms to one of a plurality of signal voltage specifications. These signal voltage specifications are defined by different transmission protocols (e.g., an HVS protocol and an LVS protocol). Therefore, the detection circuit 210 is operable to carry out detection according to these transmission protocols and generate the said detection result. For instance, the detection circuit 210 detects whether the pattern of the memory card signal conforms to the pattern of a particular signal defined by any of the transmission protocols, in which the pattern of the memory card signal may be distinguished by its amplitude, cycle, variation, etc. In another embodiment, the detection circuit 210 is configured or the detection result is predetermined by a product producer in accordance with the purpose of a product; in this case, the detection circuit 210 is independent of the intermediate circuit 200, or the detection circuit 210 is omitted providing the detection result is already determined. In the embodiment of FIG. 2b, the signal voltage specifications include a first voltage specification and a second voltage specification. The first voltage specification specifies a first operation voltage (e.g., a voltage, such as 3.3 volt, not lower than 3 volt), the second voltage specification specifies a second operation voltage (e.g., a voltage, such as the voltage between 1.2 volt and 1.8 volt, not higher than 2 volt), and the first operation voltage is higher than the second operation voltage. It should be noted that the actual voltage values of the first and second operation voltages in practice could be vary with the change of a load; generally, the actual voltage values are usually kept above the minimum voltages specified by those protocols specifying the first and second operation voltages, respectively, so as to make sure that the operation of memory card access is normal. After the detection result is generated, the control circuit 220 generates a conversion control signal and a selection control signal according to the detection result. In detail, when the detection result indicates that the memory card signal conforms to the aforementioned first voltage specification, the conversion control signal of the control circuit 220 instructs the conversion circuit 230 to execute a conversion operation and generate a card-to-system conversion signal while the selection control signal instructs the selection circuit 240 to output the card-to-system conversion signal; when the detection result indicates that the memory card signal conforms to the aforementioned second voltage specification, the selection control signal instructs the selection circuit 240 to output the memory card signal while the conversion operation does not matter, which implies that the selection circuit 240 won't output the signal from the conversion circuit 230 regardless of whether the conversion operation is executed by the conversion circuit 230. When the detection result indicates that the memory card signal conforms to the first voltage specification, the conversion circuit 230 converts the memory card signal into the card-to-system conversion signal conforming to the second voltage specification according to the conversion control signal; for instance, when the first voltage specification is in compliance with an HVS protocol and the second voltage specification is in compliance with an LVS protocol, the conversion circuit 230 will turn the memory card signal conforming to the HVS protocol into the card-to-system conversion signal conforming to the LVS protocol according to the signal specifications of these different protocols (i.e., the HSV and LVS protocols). Afterwards, provided that the memory card signal conforms to the first voltage specification (e.g., a specification of an HVS protocol), the selection circuit 240 receives the card-to-system conversion signal, and outputs the card-to-system conversion signal as a system-side output signal to the aforementioned system according to the selection control signal; provided that the memory card signal conforms to the second voltage specification (e.g., a specification of an LVS protocol), the selection circuit 240 receives the memory card signal, and outputs the memory card signal as the system-side output signal to the system according to the selection control signal.

It should be noted that from the system's point of view, the intermediate circuit 200 acts as a memory card; form the memory card's point of view, the intermediate circuit 200 acts as a system. In other words, thanks to the intermediate circuit 200, both the system and the memory card have no need to be altered in design; however, this is not a limitation to the scope of the present invention. In addition, the initialization and negotiation procedures between the intermediate circuit 200 and the system are similar to those normal procedures between a memory card and a system, or these procedures can be carried out in accordance with the aforementioned protocols; the initialization and negotiation procedures between the intermediate circuit 200 and the memory card are similar to those normal procedures between a system and a memory card, or these procedures can be carried out according to the aforementioned protocols. Since the said initialization and negotiation procedures are well known in this industrial field or these procedures can be easily derived from the prior arts, the detail is omitted.

Figure 3:
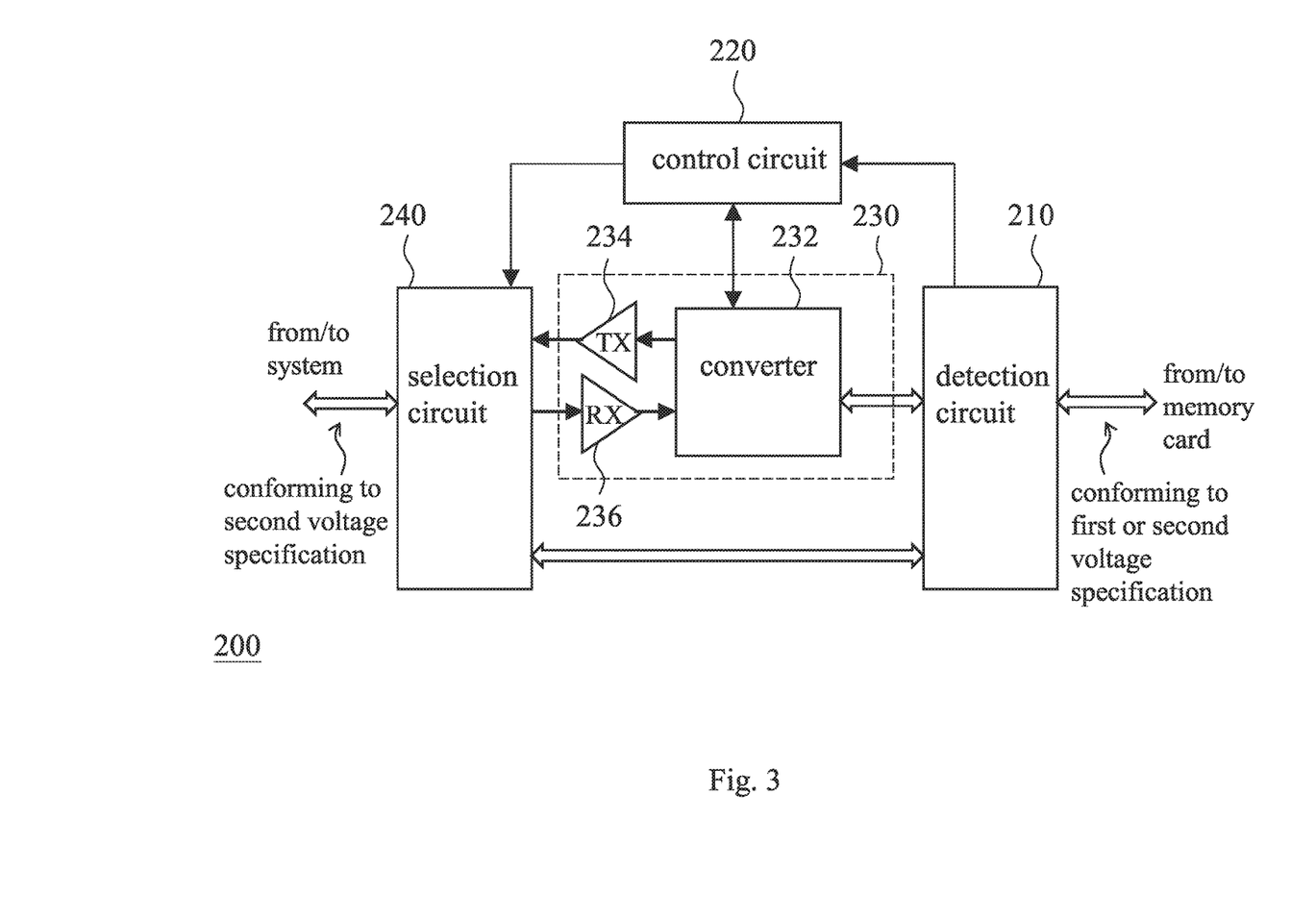

On the basis of the above, when the detection circuit 210 finds that the signal voltage specification adopted by a memory card is different from the signal voltage specification adopted by a system, the detection circuit 210 generates the detection result to have the conversion circuit 230 execute conversion accordingly; meanwhile, the conversion circuit 230 needs to communicate with the system through an proper communication manner. As shown in FIG. 3, an embodiment of the conversion circuit 230 includes a converter 232, a transmitter (labeled with "TX" in the drawings) 234 and a receiver (labeled with "RX" in the drawings) 236 for executing a conversion operation, a transmission operation and a reception operation respectively. In detail, when the detection result indicates that the memory card signal conforms to the first voltage specification, the converter 232 converts the memory card signal into a to-be-transmitted conversion signal according to the conversion control signal, the transmitter 234 generates the card-to-system conversion signal according to the to-be-transmitted conversion signal and then outputs the card-to-system conversion signal to the selection circuit 240, and the receiver 236 outputs a to-be-converted signal to the converter 232 according to a system-side signal from the selection circuit 240 for the converter 232 converting the to-be-converted signal into a system-to-card conversion signal as a card-side output signal which is then outputted to the memory card. It should he noted that when the detection result indicates that the signal voltage specifications adopted by the memory card and the system are the same, the conversion circuit 230 has no need to do signal conversion, and the selection circuit 240 is operable to directly output the memory card signal to the system according to the selection control signal, and operable to directly output the system-side signal to the memory card according to the selection control signal; in this case, the intermediate circuit 200 carries out the transmission and reception between the detection circuit 210 and the selection circuit 240 for the memory card signal and the system-side signal without using a transmitter and a receiver like the TX and the RX shown in FIG. 3. In should be also noted that if a memory card signal has no need to be converted, the detection circuit 210 (or a bypass circuit or the equivalent thereof) is operable to transmit the memory card signal to the selection circuit 240 directly, and operable to transmit the system-side signal from the selection circuit 240 to the memory card directly.

In an embodiment, the aforementioned memory card signal is a signal of Secure Digital (SD) card. In an embodiment, the aforementioned HVS protocol is one of the follows: the Default Speed (DS) transmission protocol of SD card, the High Speed (HS) transmission protocol of SD card, and the Ultra High Speed-I (UHS-I) transmission protocol of SD card, and the Ultra High Speed-II (UHS-II) transmission protocol of SD card.

Figure 2C:
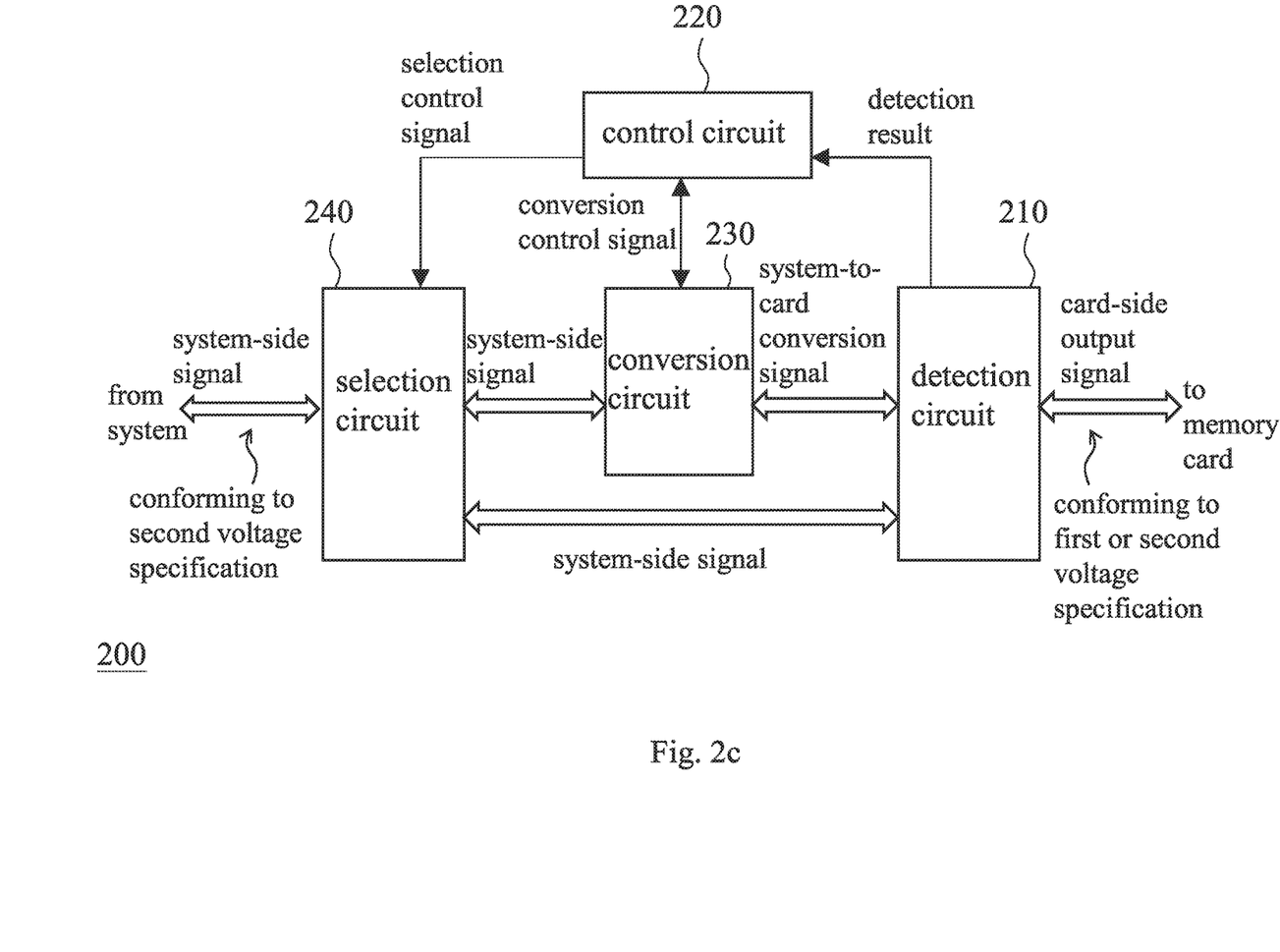
FIG. 2c illustrates the intermediate circuit of FIG. 2a for a system-to-card operation.

Please refer to FIG. 2c which shows how the intermediate circuit 200 works for a system-to-card operation. The detection circuit 210 detects a memory card signal and thereby generates a detection result. The detection result indicates that the memory card signal conforms to one of a plurality of signal voltage specifications. These signal voltage specifications include a first voltage specification and a second voltage specification. The first voltage specification specifies a first operation voltage, the second voltage specification specifies a second operation voltage, and the first operation voltage is higher than the second operation voltage. The control circuit 220 generates a conversion control signal and a selection control signal according to the detection result. When the detection result indicates that the memory card signal conforms to the first voltage specification, the conversion circuit 230 converts a system-side signal into a system-to-card conversion signal as a card-side output signal according to the conversion control signal, in which the system-side signal conforms to the second voltage specification while the system-to-card conversion signal conforms to the first voltage specification. Providing the detection result indicates that the memory card signal conforms to the first voltage specification, the selection circuit 240 receives the system-side signal and outputs the system-side signal to the conversion circuit 230 according to the selection control signal, so that the conversion circuit 230 generates the system-to-card conversion signal as the card-side output signal; providing the detection result indicates that the memory card signal conforms to the second voltage specification, the selection circuit 240 receives the system-side signal and outputs the system-side signal as the card-side output signal according to the selection control signal.

Since those of ordinary skill in the art can appreciate the detail and modification of the system-to-card operation by referring to the description of the card-to-system operation in the preceding paragraphs, which means that the features of the card-to-system operation can be applied to the system-to-card operation in a reasonable way, therefore repeated and redundant description is omitted without failing the written description and enablement requirements.

Figure 4:
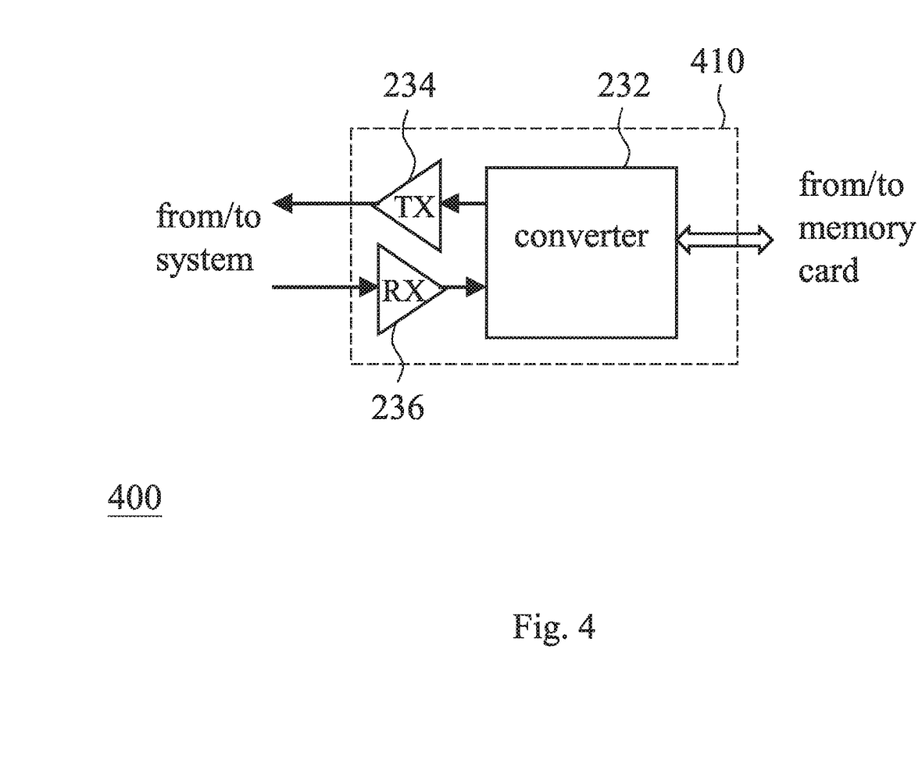
FIG. 4 illustrates another embodiment of the intermediate circuit of the present invention.

An embodiment of the intermediate circuit of the present invention only includes a conversion circuit that is used to cooperate with other circuit design. The said other circuit design could be a design having none of the aforementioned detection circuit 210, control circuit 220 and selection circuit 240, and being useful in a circumstance that the signal voltage specification of the signal between a memory card and the intermediate circuit is different from the signal voltage specification of the signal between a system and the intermediate circuit. In the said circumstance, since the conversion circuit always executes a conversion operation, the aforementioned detection, control and selection operations are no longer necessary; however, this is not a limitation to the scope of the present invention. In detail, FIG. 4 shows the embodiment of the intermediate circuit only including the conversion circuit. In FIG. 4, the intermediate circuit 400 includes the conversion circuit 410; the conversion circuit 410 is configured to receive a memory card signal according to a first voltage specification, convert the memory card signal into a card-to-system conversion signal conforming to a second voltage specification, and output the card-to-system conversion signal to a system; the conversion circuit 410 is also configured to receive a system-side signal according to the second voltage specification, convert the system-side signal into a system-to-card conversion signal conforming to the first voltage specification, and output the system-to-card conversion signal to a memory card. The first voltage specification specifies a first operation voltage, the second voltage specification specifies a second operation voltage, and the first operation voltage is higher than the second operation voltage. An embodiment of the conversion circuit 410 is the conversion circuit 230 of FIG. 3.

Since those of ordinary skill in the art can appreciate the detail and modification of the intermediate circuit 400 of FIG. 4 by referring to the disclosure of the intermediate circuit 200 in FIGS. 2a~2c and FIG. 3, which implies that the features of the intermediate circuit 200 can be applied to the intermediate circuit 400 in a reasonable way, therefore repeated and redundant description is omitted without failing the written description and enablement requirements.

To sum up, the intermediate circuit of the present invention can ensure the compatibility of memory card access without changing the existing circuit design of memory card access.

The aforementioned descriptions represent merely the exemplary embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An intermediate circuit for memory card access, comprising:
   a conversion circuit configured to receive a memory card signal according to a first voltage specification, convert the memory card signal into a card-to-system conversion signal conforming to a second voltage specification, and output the card-to-system conversion signal to a system; and the conversion circuit configured to receive a system-side signal according to the second voltage specification, convert the system-side signal into a system-to-card conversion signal conforming to the first voltage specification, and output the system-to-card conversion signal to a memory card,
   wherein the first voltage specification specifies a first operation voltage, the second voltage specification specifies a second operation voltage, and the first operation voltage is higher than the second operation voltage.

2. The intermediate circuit of claim 1, wherein the memory card signal and the system-side signal are signals of Secure Digital (SD) card.

3. The intermediate circuit of claim 1, wherein a difference between the first operation voltage and the second operation voltage is not less than one volt.

4. The intermediate circuit of claim 3, wherein the first operation voltage is not lower than three volt and the second operation voltage is not higher than two volt.

5. The intermediate circuit of claim 1, further comprising: a detection circuit detecting the memory card signal to generate a detection result indicating the memory card signal conforming to one of the first voltage specification and the second voltage specification, in which the conversion circuit converts the memory card signal into the card-to-system conversion signal when the detection result indicates that the memory card signal conforms to the first voltage specification and the conversion circuit converts the system-side signal into the system-to-card conversion signal when the detection result indicates that the memory card signal conforms to the first voltage specification.

* * * * *